(12) United States Patent
Hsu et al.

(10) Patent No.: US 10,074,433 B1
(45) Date of Patent: Sep. 11, 2018

(54) DATA ENCODING METHOD, MEMORY CONTROL CIRCUIT UNIT AND MEMORY STORAGE DEVICE

(71) Applicant: PHISON ELECTRONICS CORP., Miaoli (TW)

(72) Inventors: Yu-Cheng Hsu, Yilan County (TW); Wei Lin, Taipei (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/786,604

(22) Filed: Oct. 18, 2017

(30) Foreign Application Priority Data

Sep. 7, 2017 (TW) .............................. 106130694 A

(51) Int. Cl.
| | |
|---|---|
| *G11C 7/00* | (2006.01) |
| *G11C 16/10* | (2006.01) |
| *G11C 16/08* | (2006.01) |
| *G11C 16/24* | (2006.01) |
| *G11C 7/10* | (2006.01) |

(52) U.S. Cl.
CPC .......... *G11C 16/107* (2013.01); *G11C 7/1045* (2013.01); *G11C 16/08* (2013.01); *G11C 16/24* (2013.01)

(58) Field of Classification Search
CPC ..... G11C 16/107; G11C 16/24; G11C 7/1045; G11C 16/08
See application file for complete search history.

(56) References Cited

U.S. PATENT DOCUMENTS

| | | | |
|---|---|---|---|
| 2013/0176785 A1* | 7/2013 | Chen ................... | G06F 12/0246 365/185.12 |
| 2013/0283128 A1* | 10/2013 | Lee ..................... | G06F 11/1068 714/773 |

* cited by examiner

*Primary Examiner* — Mohammed A Bashar
(74) *Attorney, Agent, or Firm* — JCIPRNET

(57) ABSTRACT

A data encoding method, a memory control circuit unit and a memory storage device are provided. The method includes: writing a first data into a first physical programming unit of a first physical programming unit group among a plurality of physical programming unit groups; writing a second data into a second physical programming unit of a second physical programming unit group among the plurality of physical programming unit groups; encoding the first data and the second data to generate an encoded data; and writing the encoded data into a third physical programming unit group among the plurality of physical programming unit groups.

29 Claims, 13 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

| | SUB0 | | SUB1 | | | | SUB2 | | | | SUB3 | | |
|---|---|---|---|---|---|---|---|---|---|---|---|---|---|
| | RS0 | RS1 | RS2 | RS3 | RS4 | RS5 | RS6 | RS7 | RS8 | RS9 | RS10 | RS11 |
| 526(0) | L0_0 | M0_0 | U0_0 | L0_1 | M0_1 | U0_1 | L0_2 | M0_2 | U0_2 | L0_3 | M0_3 | U0_3 |
| 526(1) | L1_0 | M1_0 | U1_0 | L1_1 | M1_1 | U1_1 | L1_2 | M1_2 | U1_2 | L1_3 | M1_3 | U1_3 |
| 526(2) | L2_0 | M2_0 | U2_0 | L2_1 | M2_1 | U2_1 | L2_2 | M2_2 | U2_2 | L2_3 | M2_3 | U2_3 |
| 526(3) | L3_0 | M3_0 | U3_0 | L3_1 | M3_1 | U3_1 | L3_2 | M3_2 | U3_2 | L3_3 | M3_3 | U3_3 |
| 526(4) | L4_0 | M4_0 | U4_0 | L4_1 | M4_1 | U4_1 | L4_2 | M4_2 | U4_2 | L4_3 | M4_3 | U4_3 |
| 526(5) | L5_0 | M5_0 | U5_0 | L5_1 | M5_1 | U5_1 | L5_2 | M5_2 | U5_2 | L5_3 | M5_3 | U5_3 |

FIG. 14

| | RS0 | RS1 | RS2 | RS3 | RS4 | RS5 | RS6 | RS7 | RS8 | RS9 | RS10 | RS11 |
|---|---|---|---|---|---|---|---|---|---|---|---|---|
| 526(0) | L0_0 | M0_0 | L2_2 | L0_1 | M0_1 | L2_3 | L0_2 | M0_2 | L2_0 | L0_3 | M0_3 | L2_1 |
| 526(1) | L1_0 | M1_0 | L3_2 | L1_1 | M1_1 | L3_3 | L1_2 | M1_2 | L3_0 | L1_3 | M1_3 | L3_1 |
| 526(2) | M2_1 | U2_1 | M4_3 | M2_2 | U2_2 | M4_0 | M2_3 | U2_3 | M4_1 | M2_0 | U2_0 | M4_2 |
| 526(3) | M3_1 | U3_1 | M5_3 | M3_2 | U3_2 | M5_0 | M3_3 | U3_3 | M5_1 | M3_0 | U3_0 | M5_2 |
| 526(4) | U4_2 | L4_3 | U0_3 | U4_3 | L4_0 | U0_0 | U4_0 | L4_1 | U0_1 | U4_1 | L4_2 | U0_2 |
| 526(5) | U5_2 | L5_3 | U1_3 | U5_3 | L5_0 | U1_0 | U5_0 | L5_1 | U1_1 | U5_1 | L5_2 | U1_2 |

DATA ENCODING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 106130694, filed on Sep. 7, 2017. The entirety of the above-mentioned patent application is hereby incorporated by reference herein and made a part of this specification.

BACKGROUND

Technical Field

The invention relates to a data encoding method, a memory control circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, after a data is being written into the rewritable non-volatile memory module, the written data is usually encoded to generate an encoded data. The encoded data may be used in the subsequent accessing process for checking and correcting errors of the data. Nonetheless, when the data is being written into different physical programming units in the rewritable non-volatile memory module, the physical programming units may have different error rates due to physical characteristics of the rewritable non-volatile memory module. During the process of generating the encoded data, if once specific encoded data is generated by using data in the physical programming unit having a higher error rate, an error checking and correcting capability of that specific encoded data is also lower.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention proposes a data encoding method, a memory control circuit unit and a memory storage device, which are capable of performing an encoding operation by using upper physical programming units, center physical programming units and lower physical programming units located on different word lines and/or different sub blocks. As a result, each encoded data can have a more consistent error checking and correcting capability to increase a data decoding success rate.

The invention provides a data encoding method for a rewritable non-volatile memory module. The rewritable non-volatile memory module includes a plurality of memory cells. Each memory cell among the memory cells has a first significant bit and a second significant bit. The memory cells form a plurality of physical programming unit groups. Each physical programming unit group among the physical programming unit groups has a plurality of physical programming units. The data encoding method includes: writing a first data into a first physical programming unit of a first physical programming unit group among a plurality of physical programming unit groups, wherein a plurality of first memory cells among the memory cells form the first physical programming unit group, and the first significant bits in the first memory cells form the first physical programming units and are configured to store the first data; writing a second data into a second physical programming unit of a second physical programming unit group among the plurality of physical programming unit groups, wherein a plurality of second memory cells among the memory cells form the second physical programming unit group, and the second significant bits in the second memory cells form the second physical programming units and are configured to store the second data; and encoding the first data and the second data to generate an encoded data.

The invention provides a memory control circuit unit configured to control a rewritable non-volatile memory module. The rewritable non-volatile memory module has a plurality of memory cells. Each memory cell among the memory cells has a first significant bit and a second significant bit. The memory cells form a plurality of physical programming unit groups. Each physical programming unit group among the physical programming unit groups has a plurality of physical programming units. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured perform the following operations: writing a first data into a first physical programming unit of a first physical programming unit group among a plurality of physical programming unit groups, wherein a plurality of first memory cells among the memory cells form the first physical programming unit group, and the first significant bits in the first memory cells form the first physical programming units and are configured to store the first data; writing a second data into a second physical programming unit of a second physical programming unit group among the plurality of physical programming unit groups, wherein a plurality of second memory cells among the memory cells form the second physical programming unit group, and the second significant bits in the second memory cells form the second physical programming units and are configured to store the second data; and encoding the first data and the second data to generate an encoded data.

The invention provides a memory storage device. The memory storage device includes a connection interface unit, a rewritable non-volatile memory module and a memory control circuit unit. The connection interface unit is configured to couple to a host system. The rewritable non-volatile memory module includes a plurality of memory cells. Each memory cell among the memory cells has a first significant bit and a second significant bit. The memory cells form a plurality of physical programming unit groups. Each physical programming unit group among the physical programming unit groups has a plurality of physical programming units. The memory control circuit unit is coupled to the connection interface unit and the rewritable non-volatile memory module. The memory control circuit unit is configured to perform the following operations: writing a first data into a first physical programming unit of a first physical programming unit group among a plurality of physical programming unit groups, wherein a plurality of first memory cells among the memory cells form the first physical programming unit group, and the first significant bits in the first memory cells form the first physical programming units and are configured to store the first data; writing a second data into a second physical programming unit of a second physical programming unit group among the plurality of physical programming unit groups, wherein a plurality of second memory cells among the memory cells form the second physical programming unit group, and the second significant bits in the second memory cells form the second physical programming units and are configured to store the second data; and encoding the first data and the second data to generate an encoded data.

The invention provides a data encoding method for a rewritable non-volatile memory module. The rewritable non-volatile memory module has a plurality of memory cells. Each memory cell in the memory cells has one of a plurality of storage state. Each storage state in the storage states has a first significant bit and a second significant bit. The data encoding method includes: programming a first memory cell among the memory cells so that the first memory cell has a first storage state among the storage states; programming a second memory cell among the memory cells so that the second memory cell has a second storage state among the storage states; and performing an encoding operation according to the first significant bit in the first storage state and the second significant bit in the second storage state to generate an encoded data.

Based on the above, the data encoding method, the memory control circuit unit and the memory storage device proposed by the invention are capable of performing the encoding operation by using the upper physical programming units, the center physical programming units and the lower physical programming units located on the different word lines and/or in the different sub blocks to generate the encoded data. As a result, each encoded data can have the more consistent error checking and correcting capability to increase the decoding data success rate.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a schematic diagram illustrating management of physical erasing units according to an exemplary embodiment.

FIG. 13 is a schematic diagram illustrating a traditional approach for generating an encoded data based on the physical programming units according to an exemplary embodiment of the invention.

FIG. 14 is a schematic diagram illustrating an approach for generating an encoded data based on the physical programming units according to an exemplary embodiment of the invention.

DESCRIPTION OF THE EMBODIMENTS

Figure 1:
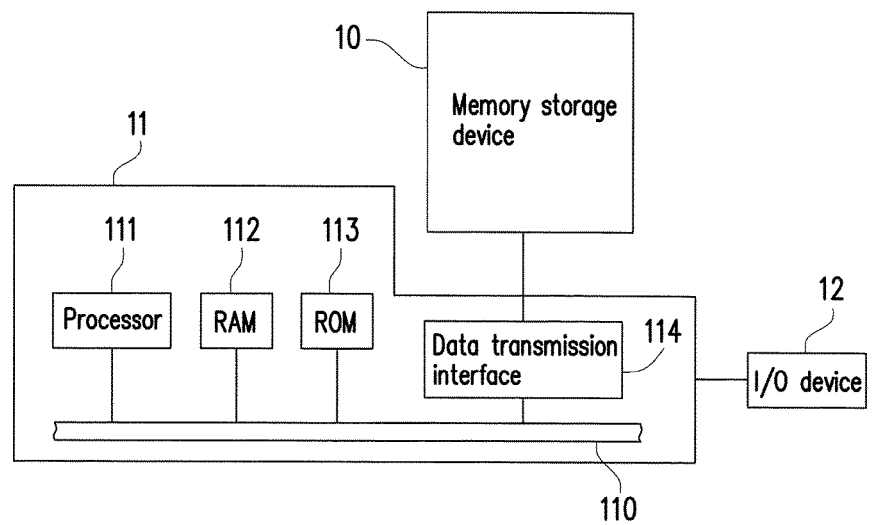
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
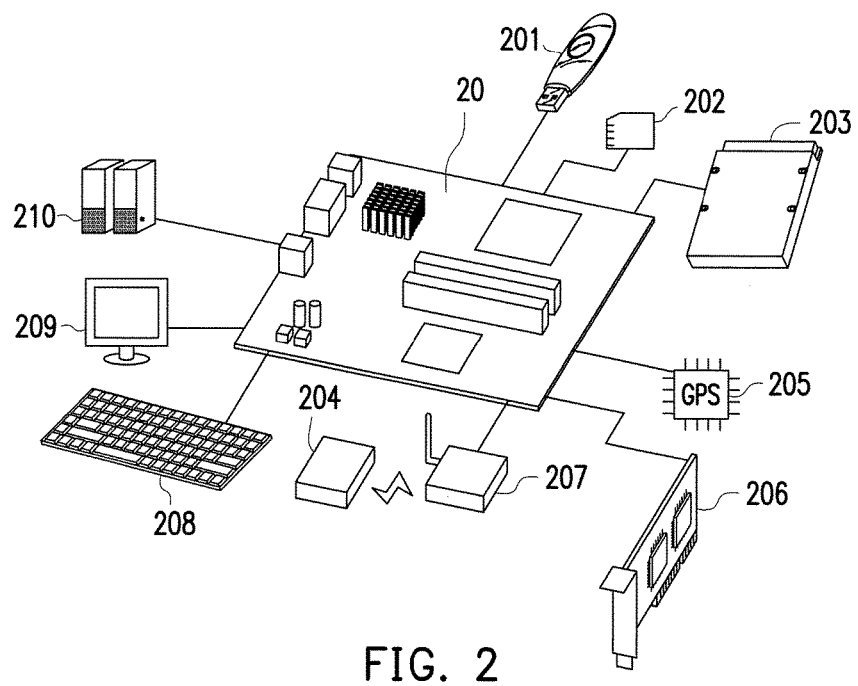
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
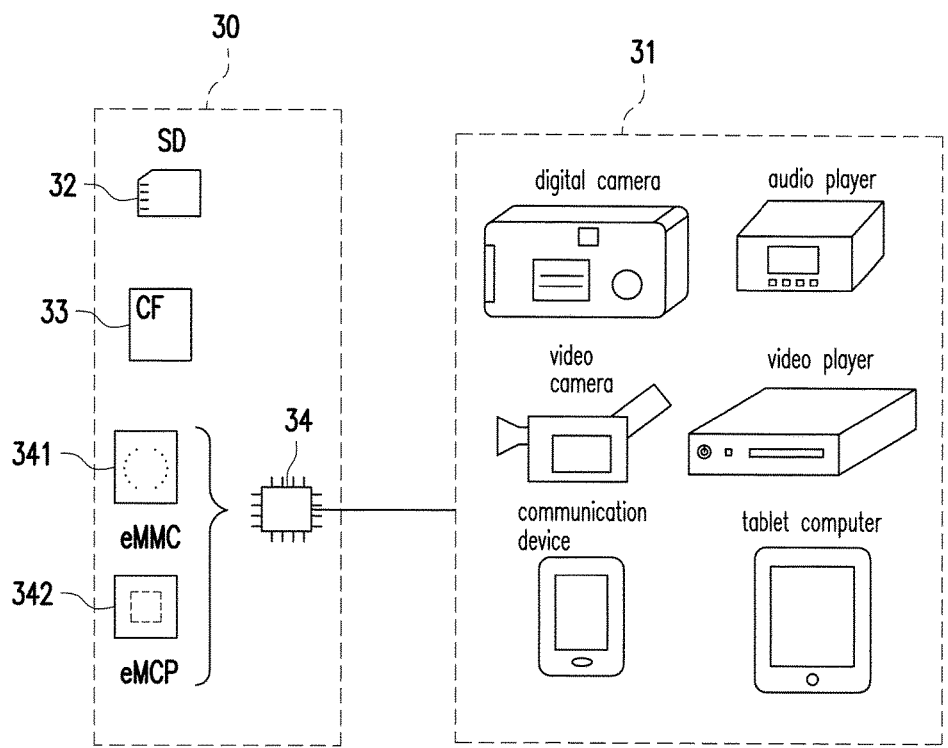
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage device 30 can be various non-volatile memory devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
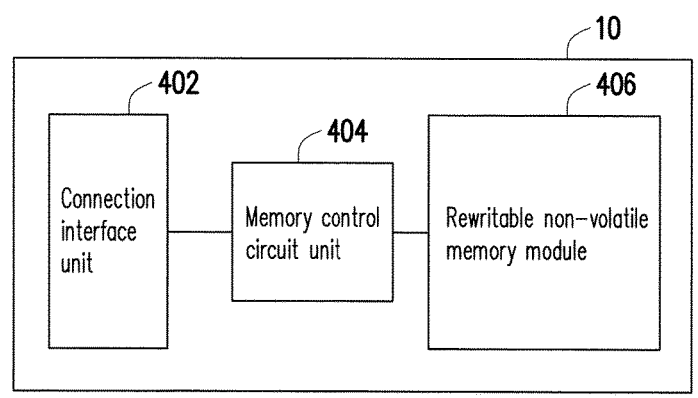
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

In this embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. Hereinafter, a two-dimensional array and a two-dimensional array are used to describe the memory cell arrays in different exemplary embodiments, respectively. However, it should be noted that, the following exemplary embodiments are simply several examples of the memory cell array. In other exemplary embodiments, a disposition method of the memory cell array may be adjusted to satisfy actual requirements.

Figure 5A:
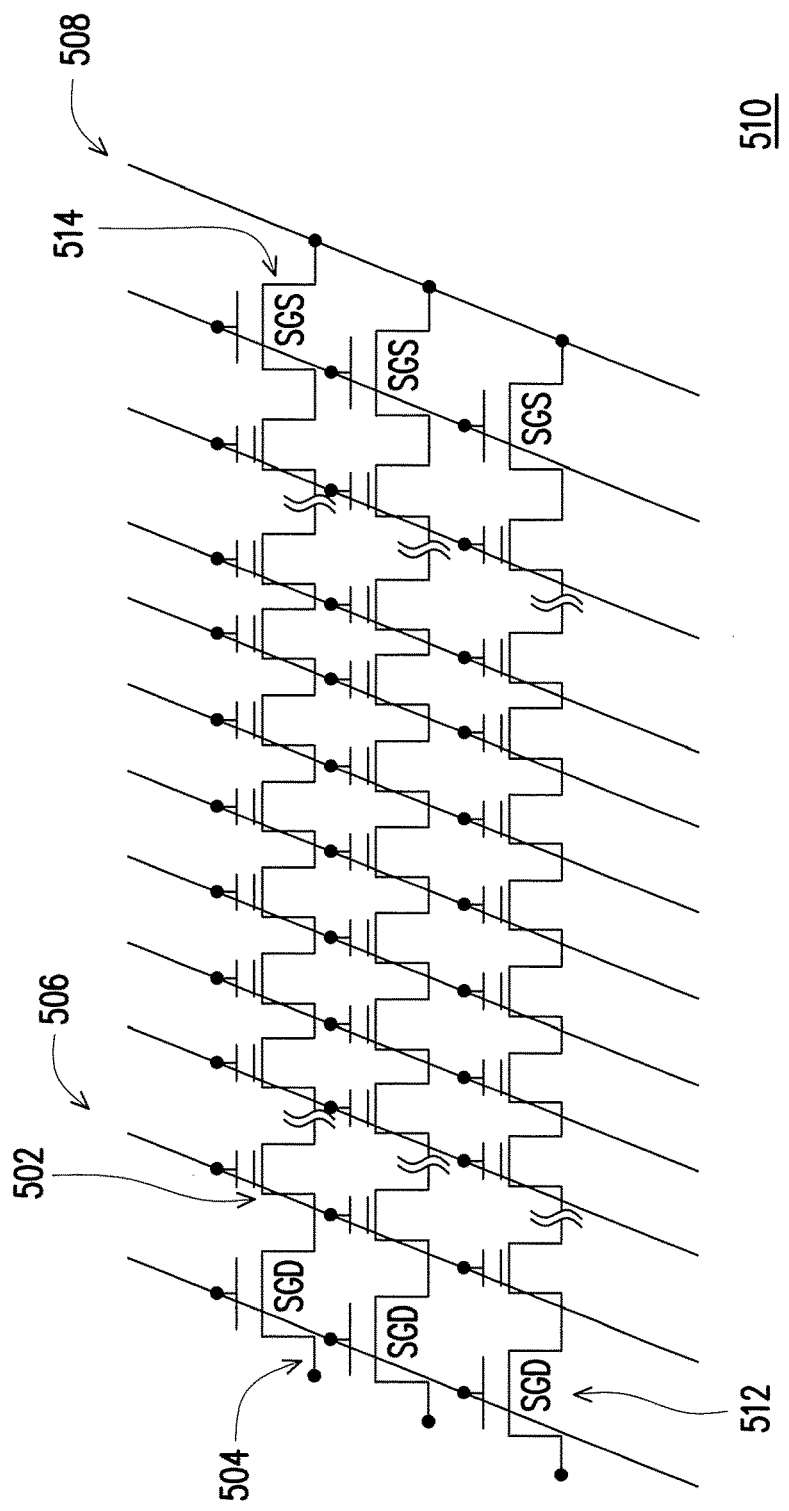
FIG. 5A is a schematic diagram illustrating a memory cell array according to an exemplary embodiment of the invention.

FIG. 5A is a schematic diagram illustrating a memory cell array according to an exemplary embodiment of the invention.

Referring to FIG. 5A, a memory cell array 510 includes a plurality of memory cells 502 used to store data, a plurality of SGD (select gate drain) transistors 512, a plurality of SGS (select gate source) transistors 514, as well as a plurality of bit lines 504, a plurality of word lines 506, a common source line 508 connected to the memory cells. The memory cells 502 are disposed in an array at intersections between the bit lines 504 and the word lines 506.

Figure 5B:
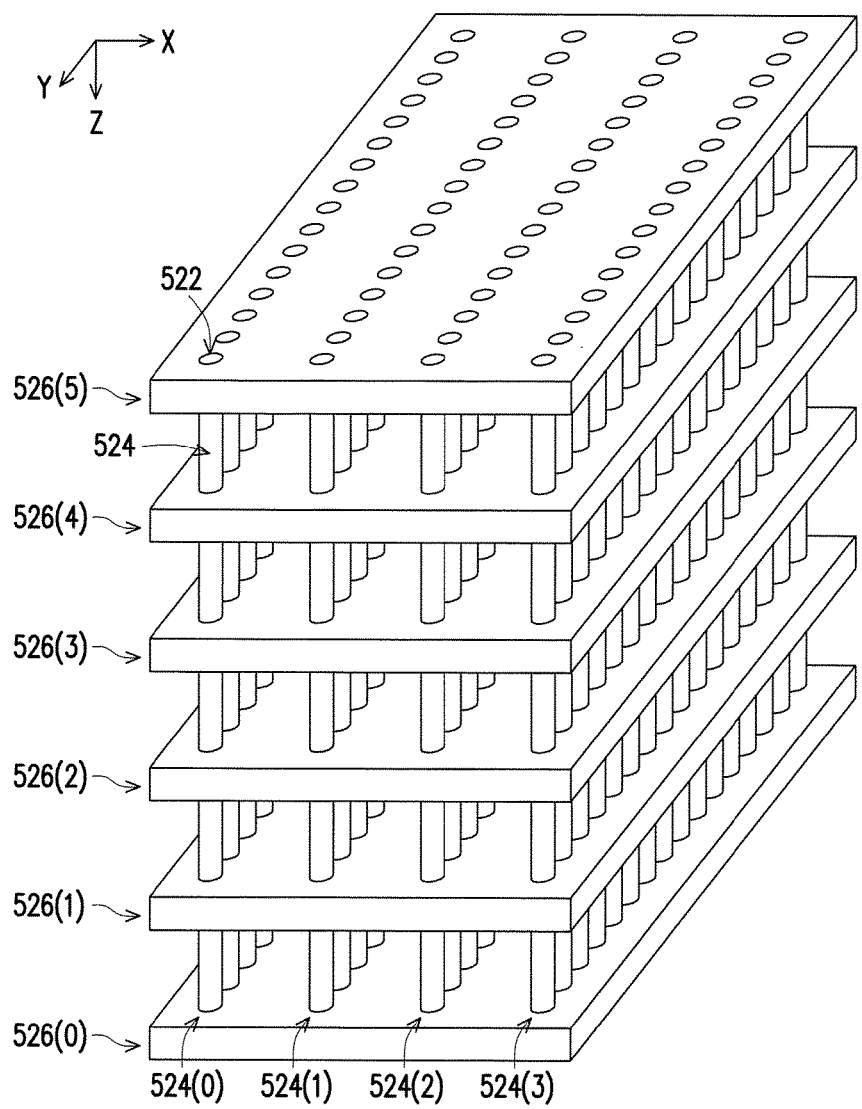
FIG. 5B is a schematic diagram illustrating a memory cell array according to another exemplary embodiment of the invention.

FIG. 5B is a schematic diagram illustrating a memory cell array according to another exemplary embodiment of the invention.

Referring to FIG. 5B, in the present exemplary embodiment, the memory cell array includes a plurality of memory cells 522 configured to store data, a plurality of bit line groups 524(0) to 524(3) and a plurality of word lines 526(0) to 526(5). In the exemplary embodiment of FIG. 5B, each word line among the word lines 526(0) to 526(5) may also be referred to as a word line layer. The bit line groups 524(0) to 524(3) are independent from one another (e.g., separated from one another) and arranged along a first direction (e.g., X-axis). Each word line group among the bit line groups 524(0) to 524(3) includes a plurality of bit lines 524 independent from one another (e.g., separated from one another). The bit lines 524 included in the bit line groups 524(0) to 524(3) are arranged along a third direction (e.g., Y-axis) and extended towards a second direction (e.g., Z-axis). The word lines 526(0) to 526(5) are independent from one another (e.g., separated from one another) and stacked along the second direction. In this exemplary embodiment, each word line among the word lines 526(0) to 526(5) may be regarded as one word line plane. The memory cell 522 is disposed at each of intersections between the bit lines 524 in the bit line groups 524(0) to 524(3) and the word lines 526(0) to 526(5). However, in another exemplary embodiment, one bit line group may include more or less bit lines, and one word line may also allow more or less bit lines to pass through.

In the rewritable non-volatile memory module 406, one or more bits are stored based on changes on a voltage (hereinafter, also known as a threshold voltage) of each of the memory cells. When a write command sequence or a read command sequence is received from the memory control circuit unit 404, a control circuit (not illustrated) in the rewritable non-volatile memory module 406 controls a voltage applied to one specific word line or one specific bit line (or bit line group) to change the threshold voltage of at least one memory cell or detect a storage state of the memory cell. For example, a charge trapping layer is provided between a control gate and a channel in each of the memory cells. Amount of electrons in the charge trapping layer may be changed by applying a write voltage (or a program voltage) to the control gate thereby changing the threshold voltage of the memory cell. This process of changing the threshold voltage is also known as "writing data into the memory cell" or "programming the memory cell". With changes in the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

Figure 6:
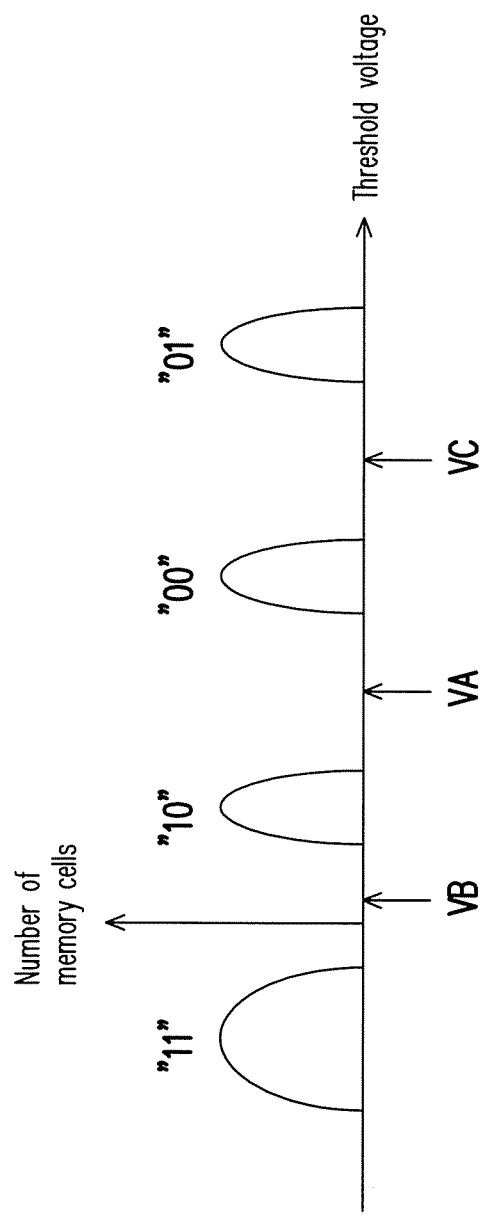
FIG. 6 is a histogram of a gate voltage corresponding to write data stored in the memory cell array according to an exemplary embodiment.

FIG. 6 is a histogram of a gate voltage corresponding to write data stored in the memory cell array according to an exemplary embodiment.

Referring to FIG. 6 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the threshold voltages and the corresponding storage states illustrated in the FIG. 6 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

Figure 7:
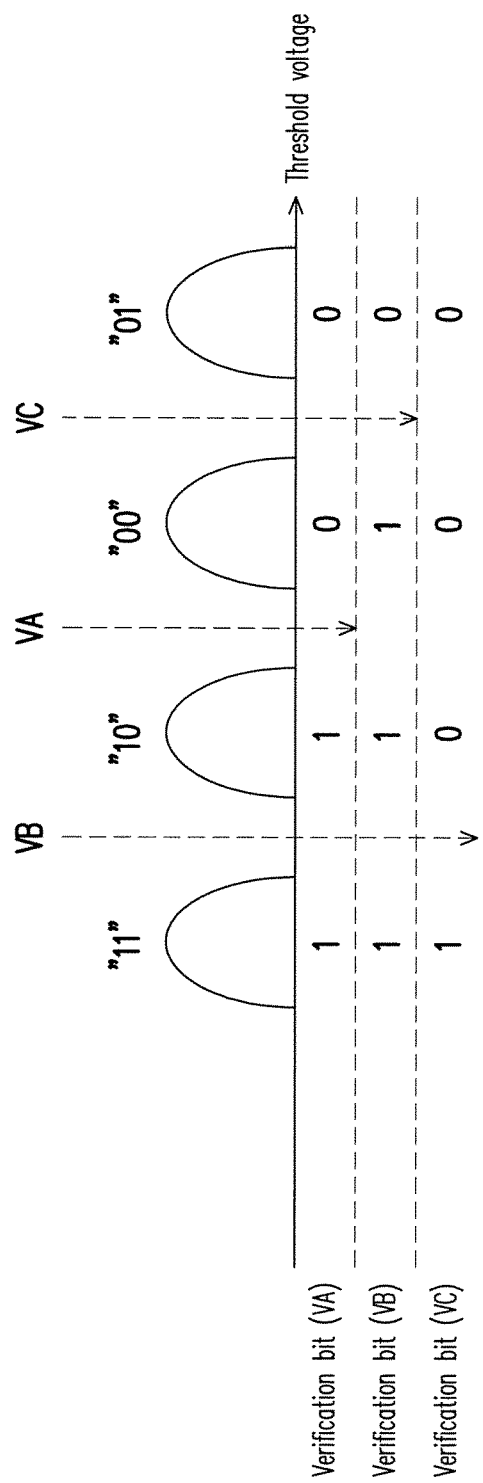
FIG. 7 illustrates a schematic diagram of reading data from a memory cell according to an exemplary embodiment.

FIG. 7 illustrates a schematic diagram of reading data from a memory cell according to an exemplary embodiment, which uses the MLC NAND flash memory for example.

Referring to FIG. 7, in a reading operation for the memory cells of the memory cell array, the read voltage is applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. Here, it is assumed that the corresponding memory cell channel is turned on when the verification bit is "1", and the corresponding memory cell channel is not turned on when the verification bit is "0". As shown in FIG. 7, the memory cell in which of the storage states may be determined according to the verification bits (VA) to (VC), such that the bits stored may also be obtained.

Figure 8:
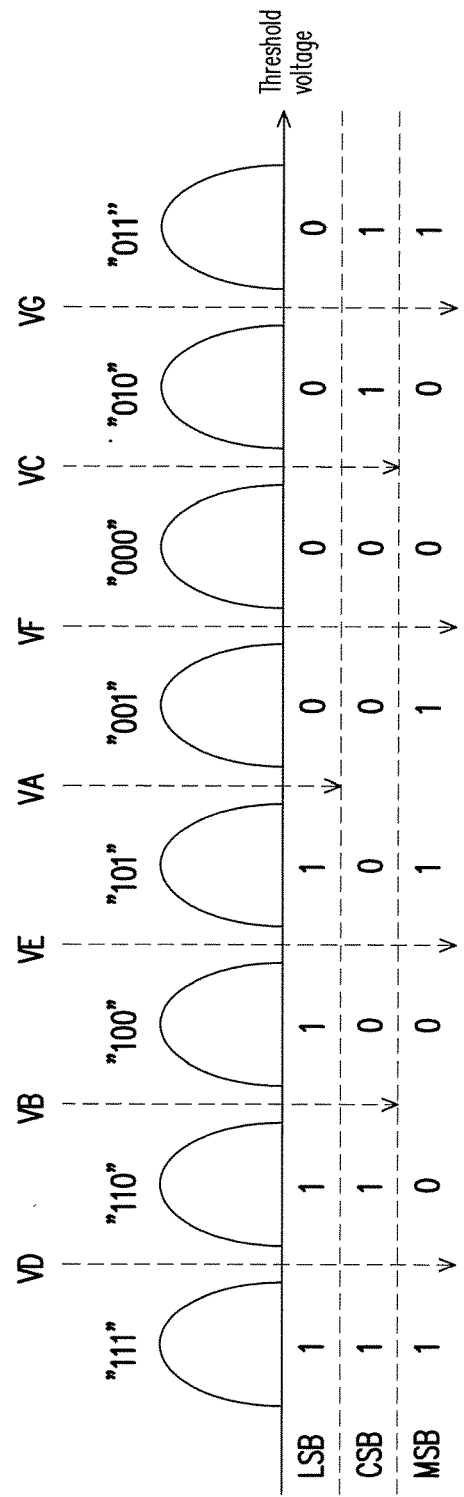
FIG. 8 illustrates a schematic diagram of reading data from a memory cell array according to another exemplary embodiment.

FIG. 8 illustrates a schematic diagram of reading data from a memory cell array according to another exemplary embodiment.

With reference to FIG. 8 that takes the TLC NAND flash memory for example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate. Here, it should be noted that, an arranging sequence of the eight storage states may be decided based on manufacturer designs instead of being limited by the arranging sequence of this embodiment.

The memory cells of the rewritable non-volatile memory module 406 constitute a plurality of physical programming units, and the physical programming units constitute a plurality of physical erasing units. Specifically, the memory cells on the same word line in FIG. 5A or the same word line in FIG. 5B constitute one or more of the physical programming units. For example, if the rewritable non-volatile memory module 406 is the MLC NAND flash memory module, the memory cells on intersections between the same word line and the bit lines constitute 2 physical programming units. Alternatively, if the rewritable non-volatile memory module 406 is the TLC NAND flash memory module, the memory cells on intersections between the same word line and the bit lines constitute 3 physical programming units.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment where one memory cell is capable of storing multiple bits (e.g., the MLC or TLC flash memory module), the physical programming units belonging to the same word line (or the same word line layer) may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. Moreover, a reliability of the lower physical programming unit is normally higher than a reliability of the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to the upper physical programming unit, and a most significant bit (MSB) of that memory cell belongs to the upper physical programming unit.

FIG. 9 is a schematic diagram illustrating management of physical erasing units according to an exemplary embodiment.

With reference to FIG. 9, in the present exemplary embodiment, one physical erasing unit is constituted by a plurality of physical programming unit groups. Each of the physical programming unit groups includes the lower physical programming units constituted by the least significant bits of a plurality of memory cells arranged on the same word line, the center physical programming units constituted by the center significant bits of those memory cells and the upper physical programming units constituted by the most significant bits of those memory cells. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 10:
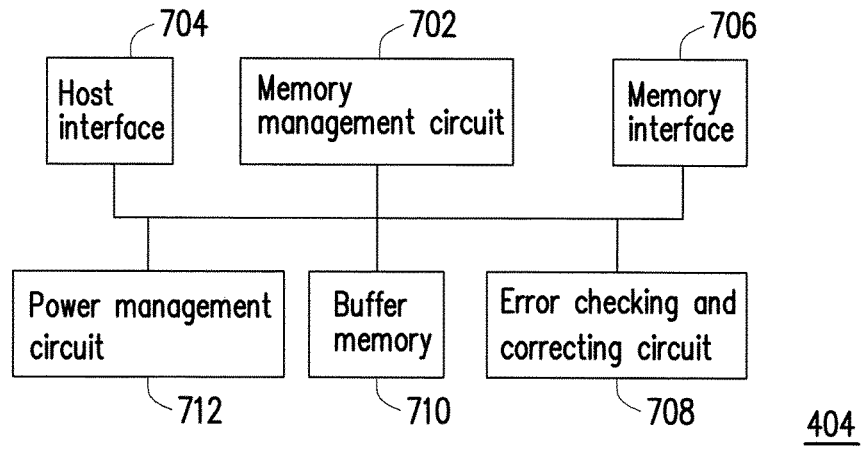
FIG. 10 is a schematic block diagram illustrating a memory control circuit unit according to an exemplary embodiment of the invention.

FIG. 10 is a schematic block diagram illustrating a memory control circuit unit according to an exemplary embodiment of the invention.

Referring to FIG. 10, the memory control circuit unit 404 includes a memory management circuit 702, a host interface 704, a memory interface 706 and an error checking and correcting circuit 708.

The memory management circuit 702 is configured to control overall operations of the memory control circuit unit 404. Specifically, the memory management circuit 702 has a plurality of control commands. These control commands are executed to perform various operations such as writing, reading and erasing data during operation of the memory storage device 10. Hereinafter, operation of the memory management circuit 702 or any circuit element in the memory control circuit unit 404 is described equivalent to operation of the memory control circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). In particular, the ROM has a boot code, which is executed by the microprocessor unit to load the control commands stored in the rewritable non-volatile memory module 406 to the RAM of the memory management circuit 702 when the memory control circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In the present exemplary embodiment, the host interface 704 is compatible with the SATA standard. Nevertheless, it should be understood that the invention is not limited to the above. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, when the memory management circuit 702 receives the write command from the host system 11, the error checking and correcting circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, when reading the data from the rewritable non-volatile memory module 406, the memory management circuit 702 will read the corresponding ECC and/or the EDC, and the error checking and correcting circuit 708 will perform the error checking and correcting operation on the read data based on the ECC and/or the EDC.

In an exemplary embodiment, the memory control circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, the error checking and correcting circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, other encoding algorithms not mentioned above may also be adopted, which are omitted herein. According to the adopted encoding algorithm, the error checking and correcting circuit 708 can encode the data to be protected, so as to generate the corresponding ECC and/or the EDC. For clear description, the ECC and/or the EDC generated by encoding are collectively known as encoded data.

Figure 11:
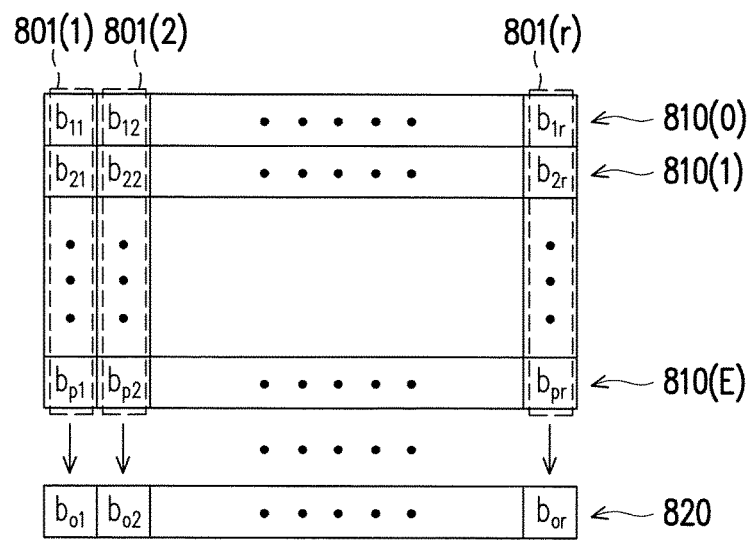
FIG. 11 is a schematic diagram illustrating a multi-frame encoding according to an exemplary embodiment of the invention.

FIG. 11 is a schematic diagram illustrating a multi-frame encoding according to an exemplary embodiment of the invention.

With reference to FIG. 11 that takes encoded data 820 correspondingly generated by encoding the data stored in physical programming units 810(0) to 810(E) as an example, in which at least a part of data stored by each of the physical programming units 810(0) to 810(E) may be regarded as one frame. In the multi-frame encoding, the data in the physical programming units 810(0) to 810(E) are encoded based on each of positions where bits (or bytes) are located. For example, bits $b_{11}$, $b_{21}$, ..., $b_{p1}$ at a position 801(1) are encoded as a bit $b_{o1}$ in the encoded data 820 and bits $b_{12}$, $b_{22}$, ..., $b_{p2}$ at a position 801(2) are encoded as a bit $b_{o2}$ in the encoded data 820; and by analogy, bits $bit_{1r}$, $b_{2r}$, ..., $b_{pr}$ at a position 801(r) are encoded as a bit $b_{or}$ in the encoded data 820. Thereafter, the data read from the physical programming units 810(0) to 810(E) may be decoded according to the encoded data 820, so that attempts on correcting possible errors in the read data may be made.

Herein, in another exemplary embodiment of FIG. 11, the data used for generating the encoded data 820 may also include redundancy bits corresponding to the data bits in the data stored in the physical programming units 810(0) to 810(E). Taking the data stored in the physical programming unit 810(0) for example, the redundancy bits therein are, for example, generated by performing the single-frame encoding for the data bits stored in the physical programming unit 810(0).

Figure 12:
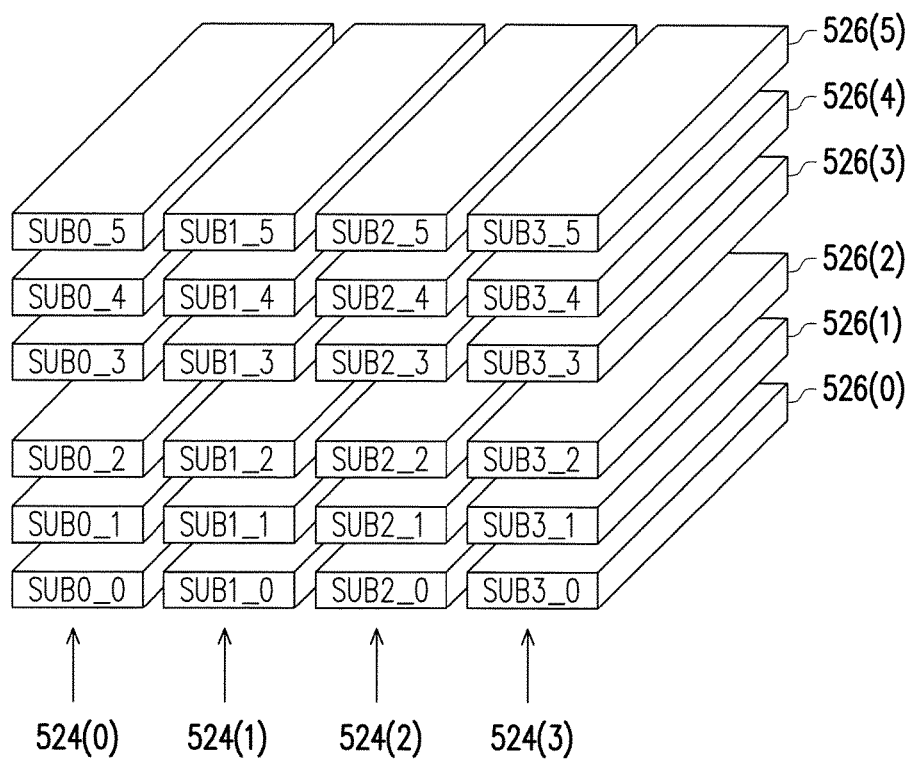
FIG. 12 is a schematic diagram illustrating relationship between physical programming units and a memory cell array according to an exemplary embodiment of the invention.

FIG. 12 is a schematic diagram illustrating relationship between physical programming units and a memory cell array according to an exemplary embodiment of the invention.

With reference to FIG. 12, a memory cell array of FIG. 12 is substantially identical to the memory cell array of FIG. 5B. In the present exemplary embodiment, it is assumed that, one word line can include one physical erasing unit, and that physical erasing unit can include a plurality of physical programming unit groups. Each of the physical programming unit groups includes the upper physical programming unit, the center physical programming unit and the lower physical programming unit. Further, the memory cells disposed on an intersection between one bit line group and one word line form one physical programming unit group.

For instance, the word line 526(5) includes a physical programming unit group SUB0_5, a physical programming unit group SUB1_5, a physical programming unit group SUB2_5 and a physical programming unit group SUB3_5. The physical programming unit group SUB0_5, the physical programming unit group SUB1_5, the physical programming unit group SUB2_5 and the physical programming unit group SUB3_5 constitute one physical erasing unit. Each physical programming unit group among the physical programming unit group SUB0_5, the physical programming unit group SUB1_5, the physical programming unit group SUB2_5 and the physical programming unit group SUB3_5 includes the upper physical programming units, the center physical programming units and the lower physical programming units. In particular, the memory cells disposed on an intersection between the bit line group 524(0) and the word line 526(5) form the physical programming unit group SUB0_5. The memory cells disposed on an intersection between the bit line group 524(1) and the word line 526(5) form the physical programming unit group SUB1_5. The memory cells disposed on an intersection between the bit line group 524(2) and the word line 526(5) form the physical programming unit group SUB2_5. The memory cells disposed on an intersection between the bit line group 524(3) and the word line 526(5) form the physical programming unit group SUB3_5.

Moreover, the word line 526(4) includes a physical programming unit group SUB0_4, a physical programming unit group SUB1_4, a physical programming unit group SUB2_4 and a physical programming unit group SUB3_4. The word line 526(3) includes a physical programming unit group SUB0_3, a physical programming unit group SUB1_3, a physical programming unit group SUB2_3 and a physical programming unit group SUB3_3. The word line 526(2) includes a physical programming unit group SUB0_2, a physical programming unit group SUB1_2, a physical programming unit group SUB2_2 and a physical programming unit group SUB3_2. The word line 526(1) includes a physical programming unit group SUB0_1, a physical programming unit group SUB1_1, a physical programming unit group SUB2_1 and a physical programming unit group SUB3_1. The word line 526(0) includes a physical programming unit group SUB0_0, a physical programming unit group SUB1_0, a physical programming unit group SUB2_0 and a physical programming unit group SUB3_0. The relationship of each of aforesaid word lines and the respective physical programming unit group included therein is similar to the relationship among the word line 526(5), the bit line groups 524(0) to 524(3), the physical programming unit group SUB0_5, the physical programming unit group SUB1_5, the physical programming unit group SUB2_5 and the physical programming unit group SUB3_5, which is not repeated hereinafter.

In particular, for the memory cells located in the different word lines, if the memory cells in the different word lines are connected to the same bit line group, the physical programming unit groups constituted by the memory cells connected to the same bit line group may be collectively referred to as one sub block. For instance, since the memory cells in the physical programming unit group SUB0_5, the physical programming unit group SUB0_4, the physical programming unit group SUB0_3, the physical programming unit group SUB0_2, the physical programming unit group SUB0_1 and the physical programming unit group SUB0_0 are connected to the bit line group 524(0) in FIG. 12, the physical programming unit group SUB0_5, the physical programming unit group SUB0_4, the physical programming unit group SUB0_3, the physical programming unit group SUB0_2, the physical programming unit group SUB0_1 and the physical programming unit group SUB0_0 can constitute one sub block SUB0 (not shown).

Similarly, since the memory cells in the physical programming unit group SUB1_5, the physical programming unit group SUB1_4, the physical programming unit group SUB1_3, the physical programming unit group SUB1_2, the physical programming unit group SUB1_1 and the physical programming unit group SUB1_0 are connected to the bit line group 524(1), the physical programming unit group SUB1_5, the physical programming unit group SUB1_4, the physical programming unit group SUB1_3, the physical programming unit group SUB1_2, the physical programming unit group SUB1_1 and the physical programming unit group SUB1_0 can constitute one sub block SUB1 (not shown).

Similarly, since the memory cells in the physical programming unit group SUB2_5, the physical programming unit group SUB2_4, the physical programming unit group SUB2_3, the physical programming unit group SUB2_2, the physical programming unit group SUB2_1 and the physical programming unit group SUB2_0 are connected to the bit line group 524(2), the physical programming unit group SUB2_5, the physical programming unit group SUB2_4, the physical programming unit group SUB2_3, the physical programming unit group SUB2_2, the physical programming unit group SUB2_1 and the physical programming unit group SUB2_0 can constitute one sub block SUB2 (not shown).

Similarly, since the memory cells in the physical programming unit group SUB3_5, the physical programming unit group SUB3_4, the physical programming unit group SUB3_3, the physical programming unit group SUB3_2, the physical programming unit group SUB3_1 and the physical programming unit group SUB3_0 are connected to the bit line group 524(3), the physical programming unit group SUB3_5, the physical programming unit group SUB3_4, the physical programming unit group SUB3_3, the physical programming unit group SUB3_2, the physical programming unit group SUB3_1 and the physical programming unit group SUB3_0 can constitute one sub block SUB3 (not shown).

Traditionally, all the upper physical programming units in the same sub block will be encoded to generate an encoded data, all the center physical programming units in the same sub block will be encoded to generate an encoded data, and all the lower physical programming units in the same sub block will be encoded to generate an encoded data.

For instance, FIG. 13 is a schematic diagram illustrating a traditional approach for generating an encoded data based on the physical programming units according to an exemplary embodiment of the invention.

Referring to FIG. 12 and FIG. 13 together, it is assumed that the upper physical programming units, the center physical programming units and the lower physical programming unit in each physical programming units group are written with data in FIG. 12. In the traditional approach, the memory management circuit 702 will perform an encoding operation on a lower physical programming unit L0_0 of the physical programming unit group SUB0_0, a lower physical programming unit L1_0 of the physical programming unit group SUB0_1, a lower physical programming unit L2_0 of the physical programming unit group SUB0_2, a lower physical programming unit L3_0 of the physical programming unit group SUB0_3, a lower physical programming unit L4_0 of the physical programming unit group SUB0_4 and a lower physical programming unit L5_0 of the physical programming unit group SUB0_5 in the sub block SUB0 to generate an encoded data RS0.

Similarly, the memory management circuit 702 will perform the encoding operation on a center physical programming unit M0_0 of the physical programming unit group SUB0_0, a center physical programming unit M1_0 of the physical programming unit group SUB0_1, a center physical programming unit M2_0 of the physical programming unit group SUB0_2, a center physical programming unit M3_0 of the physical programming unit group SUB0_3, a center physical programming unit M4_0 of the physical programming unit group SUB0_4 and a center physical programming unit M5_0 of the physical programming unit group SUB0_5 in the sub block SUB0 to generate an encoded data RS1.

Similarly, the memory management circuit 702 will perform the encoding operation on an upper physical programming unit U0_0 of the physical programming unit group SUB0_0, an upper physical programming unit U1_0 of the physical programming unit group SUB0_1, an upper physical programming unit U2_0 of the physical programming unit group SUB0_2, an upper physical programming unit U3_0 of the physical programming unit group SUB0_3, an upper physical programming unit U4_0 of the physical programming unit group SUB0_4 and an upper physical programming unit U5_0 of the physical programming unit group SUB0_5 in the sub block SUB0 to generate an encoded data RS2.

As similar to the method for generating the encoded data RS0, the encoded data RS1 and the encoded data RS2, the memory management circuit 702 will perform the encoding operation on all the lower physical programming units in the sub block SUB1 to generate an encoded data RS3, perform the encoding operation on all the center physical programming units in the sub block SUB1 to generate an encoded data RS4 and perform the encoding operation on all the upper physical programming units in the sub block SUB1 to generate an encoded data RS5. The memory management circuit 702 will perform the encoding operation on all the lower physical programming units in the sub block SUB2 to generate an encoded data RS6, perform the encoding operation on all the center physical programming units in the sub block SUB2 to generate an encoded data RS7 and perform the encoding operation on all the upper physical programming units in the sub block SUB2 to generate an encoded data RS8. The memory management circuit 702 will perform the encoding operation on all the lower physical programming units in the sub block SUB3 to generate an encoded data RS9, perform the encoding operation on all the center physical programming units in the sub block SUB3 to generate an encoded data RS10 and perform the encoding operation on all the upper physical programming units in the sub block SUB3 to generate an encoded data RS11.

However, it should be noted that, due to the physical characteristics of the rewritable non-volatile memory module 406, the different physical programming units may have different error rates while being programmed (or being written with data). In general, the error rates arranged from large to small are the center physical programming unit, the upper physical programming unit and the lower physical programming unit in that sequence. In other words, if the memory management circuit 702 performs the encoding operation simply by using the data in the center physical programming units to generate the encoded data (e.g., the encoded data RS1, the encoded data RS4, the encoded data RS7 and the encoded data RS10), an error checking and correcting capability of such encoded data may be lower.

Accordingly, the invention proposes a data encoding method capable of performing an encoding operation by using the upper physical programming units, the center physical programming units and the lower physical programming units located on different word lines and/or in different sub block to generate the encoded data. As a result, each encoded data can have the more consistent error checking and correcting capability to increase the data decoding success rate.

Specifically, FIG. 14 is a schematic diagram illustrating an approach for generating an encoded data based on the physical programming units according to an exemplary embodiment of the invention.

Referring to FIG. 12 and FIG. 14 together, it is assumed that the upper physical programming units, the center physical programming units and the lower physical programming unit in each physical programming units group are written with data in FIG. 12. In the data encoding method of the invention, the memory management circuit 702 performs an encoding operation on the lower physical programming unit L0_0 of the physical programming unit group SUB0_0 in the sub block SUB0, the lower physical programming unit L1_0 of the physical programming unit group SUB0_1 in the sub block SUB0, the center physical programming unit M2_1 of the physical programming unit group SUB1_2 in the sub block SUB1, the center physical programming unit M3_1 of the physical programming unit group SUB1_3 in the sub block SUB1, the upper physical programming unit U4_2 of the physical programming unit group SUB2_4 in the sub block SUB2 and the upper physical programming unit U5_2 of the physical programming unit group SUB2_5 in the sub block SUB2 to generate the encoded data RS0.

It should noted herein that, the physical programming unit group SUB2_5 and the physical programming unit group SUB2_4 may be collectively referred to as "a first physical programming unit group", and the upper physical programming unit U5_2 and the upper physical programming unit U4_2 may be collectively referred to as "a first physical programming unit". The physical programming unit group SUB1_3 and the physical programming unit group SUB1_2 may be collectively referred to as "a fourth physical programming unit group", and the center physical programming unit M3_1 and the center physical programming unit M2_1 may be collectively referred to as "a third physical programming unit". The physical programming unit group SUB0_1 and the physical programming unit group SUB0_0 may be collectively referred to as "a second physical programming unit group", and the lower physical programming unit L1_0 and the lower physical programming unit L0_0 may be collectively referred to as "a second physical programming unit". In other words, the memory management circuit 702 encodes data in the first physical programming unit (a.k.a. a first data), data in the third physical programming unit (a.k.a. a third data) and data in the second physical programming unit (a.k.a. a second data) to generate the encoded data RS0, and stores the encoded data RS0 into a physical programming unit group (a.k.a. a third physical programming unit group). The encoded data RS0 is configured to correct errors occurred when writing the first data, the second data and the third data into the first physical programming unit, the second physical programming unit and the third physical programming unit respectively.

It should be noted that, the invention is not intended to limit the time point for generating the encoded data RS0. In an embodiment, the memory management circuit 702 can encode the first data, the second data and the third data to generate the encoded data RS0 before writing the first data, the second data and the third data into the first physical programming unit, the second physical programming unit and the third physical programming unit respectively. Nonetheless, in another embodiment, the memory management circuit 702 may also write the first data, the second data and the third data into the first physical programming unit, the second physical programming unit and the third physical programming unit respectively before encoding the first data, the second data and the third data to generate the encoded data RS0.

It should also be noted that, in the present exemplary embodiment, the first physical programming unit is "the upper physical programming unit" in one physical programming unit group, but the invention is not limited thereto. In other exemplary embodiments, the first physical programming unit may also be "the center physical programming unit" or "the lower physical programming unit" in one physical programming unit group. Similarly, in the present exemplary embodiment, the third physical programming unit is "the center physical programming unit" in one physical programming unit group, but the invention is not limited thereto. In other exemplary embodiments, the third physical programming unit may also be "the upper physical programming unit" or "the lower physical programming unit" in one physical programming unit group. Similarly, in the present exemplary embodiment, the second physical programming unit is "the lower physical programming unit" in one physical programming unit group, but the invention is not limited thereto. In other exemplary embodiments, the second physical programming unit may also be "the upper physical programming unit" or "the center physical programming unit" in one physical programming unit group.

Particularly, in the present exemplary embodiment, the first physical programming unit group is constituted by the memory cells (a.k.a. first memory cells) of the physical programming unit group SUB2_4 and the physical programming unit group SUB2_5 on the word lines 526(4) to 526(5) (a.k.a. first word lines), and the first memory cells are located on intersections between the word lines 526(4) to 526(5) and the bit line group 524(2) (a.k.a. a first bit line group).

In the present exemplary embodiment, the fourth physical programming unit group is constituted by the memory cells (a.k.a. third memory cells) of the physical programming unit group SUB1_2 and the physical programming unit group SUB1_3 on the word lines 526(2) to 526(3) (a.k.a. third word lines), and the third memory cells are located on intersections between the word lines 526(2) to 526(3) and the bit line group 524(1) (a.k.a. a third bit line group).

In the present exemplary embodiment, the second physical programming unit group is constituted by the memory cells (a.k.a. second memory cells) of the physical programming unit group SUB0_0 and the physical programming unit group SUB0_1 on the word lines 526(0) to 526(1) (a.k.a. second word lines), and the second memory cells are located on intersections between the word lines 526(0) to 526(1) and the bit line group 524(0) (a.k.a. a second bit line group).

It should be noted that, aforesaid method for generating the encoded data is described from the perspective of "the physical programming unit". Nevertheless, in an embodiment of the invention, aforesaid method for generating the encoded data may also be described from the perspective of "the memory cell". Specifically, the method for generating aforesaid encoded data RS0 may also be: performing an encoding operation according to the most significant bit (a.k.a. a first significant bit) of a storage state (a.k.a. a first storage state) of the memory cells (i.e., the first memory cells) of the physical programming unit group SUB2_4 and the physical programming unit group SUB2_5, the center significant bit (a.k.a. a third significant bit) of a storage state (a.k.a. a third storage state) of the memory cells (i.e., the third memory cells) of the physical programming unit group SUB1_2 and the physical programming unit group SUB1_3 and the least significant bit (a.k.a. a second significant bit) of a storage state (a.k.a. a second storage state) of the memory cells (i.e., the second memory cells) of the physical programming unit group SUB0_0 and the physical programming unit group SUB0_1. It should be noted that, in the present exemplary embodiment, the first significant bits in the first memory cells form the upper physical programming unit U5_2 and the upper physical programming unit U4_2 (i.e., the first physical programming unit) and are configured to store aforesaid first data. Similarly, the third significant bits in the third memory cells form the center physical programming unit M3_1 and the center physical programming unit M2_1 (i.e., the third physical programming unit) and are configured to store aforesaid third data. Similarly, the second significant bits in the second memory cells form the lower physical programming unit L1_0 and the lower physical programming unit L0_0 (i.e., the second physical programming unit) and are configured to store aforesaid second data.

It should be noted that, each of the first storage state, the second storage state and the third storage state may be one of a plurality of storage states illustrated in FIG. 8. Among them, the first storage state, the second storage state and the third storage state may be the same storage state or different storage states. The invention is not intended to limit the actual storage states of the first storage state, the second storage state and the third storage state. Further, in the present exemplary embodiment, the first significant bit is "the most significant bit". However, in other embodiments, the first significant bit may also be "the center significant bit" or "the least significant bit". Similarly, in the present exemplary embodiment, the third significant bit is "the center significant bit". However, in other embodiments, the third significant bit may also be "the most significant bit" or "the least significant bit". Similarly, in the present exemplary embodiment, the second significant bit is "the least significant bit". However, in other embodiments, the second significant bit may also be "the most significant bit" or "the center significant bit".

Similarly, the method for generating the encoded data is described again from the perspective of "the physical programming unit" as follows. The memory management circuit 702 performs the encoding operation on the center physical programming unit M0_0 of the physical programming unit group SUB0_0 in the sub block SUB0, the center physical programming unit M1_0 of the physical programming unit group SUB0_1 in the sub block SUB0, the upper physical programming unit U2_1 of the physical programming unit group SUB1_2 in the sub block SUB1, the upper physical programming unit U3_1 of the physical programming unit group SUB1_3 in the sub block SUB1, the lower physical programming unit L4_3 of the physical programming unit group SUB3_4 in the sub block SUB3 and the lower physical programming unit L5_3 of the physical programming unit group SUB3_5 in the sub block SUB3 to generate the encoded data RS1.

Similarly, the memory management circuit 702 performs the encoding operation on the upper physical programming unit U0_0 of the physical programming unit group SUB0_0 in the sub block SUB0, the upper physical programming unit U1_0 of the physical programming unit group SUB0_1 in the sub block SUB0, the lower physical programming unit L2_2 of the physical programming unit group SUB2_2 in the sub block SUB2, the lower physical programming unit L3_2 of the physical programming unit group SUB2_3 in the sub block SUB2, the center physical programming unit M4_3 of the physical programming unit group SUB3_4 in the sub block SUB3 and the center physical programming unit M5_3 of the physical programming unit group SUB3_5 in the sub block SUB3 to generate the encoded data RS2.

It should be noted herein that, the encoding method for the encoded data RS3 to the encoded data RS11 may be similar to aforementioned method for generating the encoded data that generates encoded data RS0 to the encoded data RS2 by using the upper physical programming units, the center physical programming units and the lower physical programming units located on the different word lines and/or in the different sub blocks, which is not repeated hereinafter. The generated encoded data may be stored into one or more physical programming unit groups.

It is to be noted that, the method for generating the encoded data is described above with the TLC NAND flash memory module as an example, but the invention is not limited thereto. In an embodiment, the data encoding method of the invention may also be applied in the MLC NAND flash memory module. For example, in an embodiment where the data encoding method is applied in the MLC NAND flash memory module, it also is assumed that one word line can include one physical erasing unit. That physical erasing unit includes a plurality of physical programming unit groups, and each physical programming unit group includes the upper physical programming unit and the lower physical programming unit. Further, the memory cells disposed on an intersection between one bit line group and one word line form one physical programming unit group. The memory management circuit 702 can encode data of the upper physical programming units of a physical programming unit group and data of the lower physical programming units of another physical programming unit group to generate an encoded data, and then write the encoded data into other physical programming unit group. Alternatively, from the perspective of the memory cell, the memory management circuit 702 can perform an encoding operation according to the most significant bit of the storage state of one memory cell and the least significant bit in the storage state of another memory cell to generate the encoded data. Said most significant bit can correspond to the upper physical programming unit, and said least significant bit can correspond to the lower physical programming unit.

Further, in the foregoing embodiments, the upper physical programming unit, the center physical programming unit and the lower physical programming unit on which the encoding operation is performed are constituted by the memory cells located in the different word lines, respectively. However, the invention is not limited to the above. In an embodiment, the upper physical programming unit, the center physical programming unit and the lower physical programming unit on which the encoding operation is performed may also be constituted by the memory cells located in the same word line. From the perspective of the memory cell, the encoding operation may be performed on the least significant bits, the center significant bits and the most significant bits of the storage states respectively included by each of the memory cells in the same word line to generate the encoded data.

Figure 15:
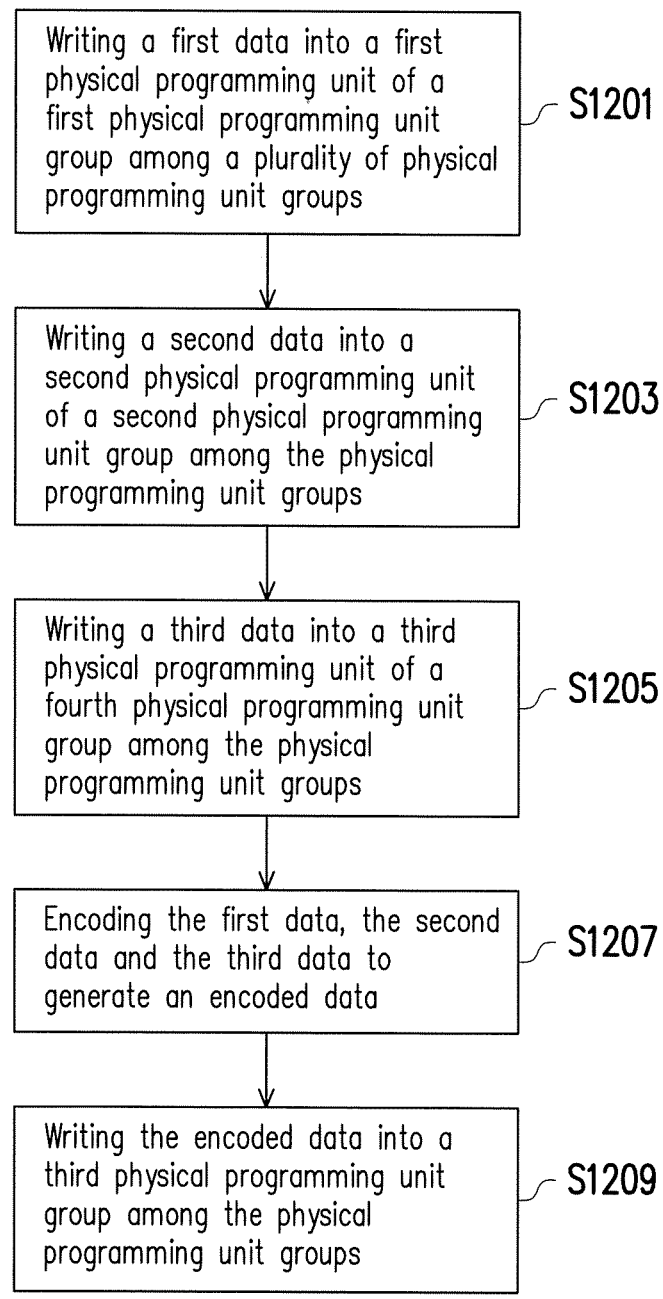
FIG. 15 is a flowchart illustrating a data encoding method according to an exemplary embodiment of the invention.

FIG. 15 is a flowchart illustrating a data encoding method according to an exemplary embodiment of the invention. In particular, FIG. 15 is a flowchart illustrating a data encoding method for encoding from the perspective of "the physical programming unit".

With reference to FIG. 15, in step S1201, the memory management circuit 702 writes a first data into a first physical programming unit of a first physical programming unit group among a plurality of physical programming unit groups. Here, a plurality of first memory cells in the rewritable non-volatile memory module 406 form the first physical programming unit group, and the first significant bits in the first memory cells form the first physical programming units and are configured to store the first data. In step S1203, the memory management circuit 702 writes a second data into a second physical programming unit of a second physical programming unit group among the physical programming unit groups. Herein, a plurality of second memory cells in the rewritable non-volatile memory module 406 form the second physical programming unit group, and the second significant bits in the second memory cells form the second physical programming units and are configured to store the second data. In step S1205, the memory management circuit 702 writes a third data into a third physical programming unit of a fourth physical programming unit group among the physical programming unit groups. Herein, a plurality of third memory cells in the rewritable non-volatile memory module 406 form the fourth physical programming unit group, and the third significant bits in the third memory cells form the third physical programming units and are configured to store the third data. In step S1207, the memory management circuit 702 encodes the first data, the second data and the third data to generate an encoded data. Lastly, in step S1209, the memory management circuit 702 writes the encoded data into a third physical programming unit group among the physical programming unit groups.

Figure 16:
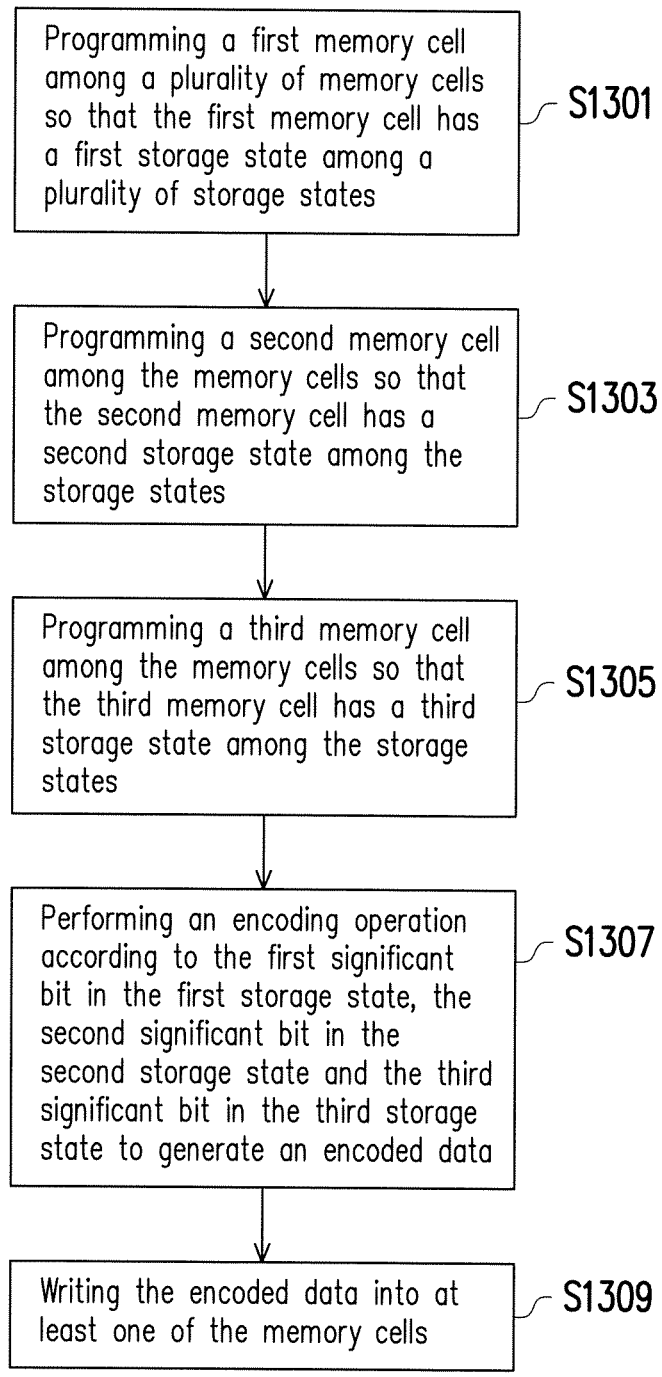
FIG. 16 is a flowchart illustrating a data encoding method according to another exemplary embodiment of the invention.

FIG. 16 is a flowchart illustrating a data encoding method according to another exemplary embodiment of the invention. In particular, FIG. 16 is a flowchart illustrating a data encoding method for encoding from the perspective of "the memory cell".

With reference to FIG. 16, in step S1301, the memory management circuit 702 programs a first memory cell among a plurality of memory cells so that the first memory cell has a first storage state among the storage states. In step S1303, the memory management circuit 702 programs a second memory cell among the memory cells so that the second memory cell has a second storage state among the storage states. In step S1305, the memory management circuit 702 programs a third memory cell among the memory cells so that the third memory cell has a third storage state among the storage states. In step S1307, the memory management circuit 702 performs an encoding operation according to the first significant bit in the first storage state, the second significant bit in the second storage state and the third significant bit in the third storage state to generate an encoded data. Lastly, in step S1309, the memory management circuit 702 writes the encoded data into at least one of the memory cells.

In summary, the data encoding method, the memory control circuit unit and the memory storage device proposed by the invention are capable of performing the encoding operation by using the upper physical programming units, the center physical programming units and the lower physical programming units located on the different word lines and/or in the different sub blocks to generate the encoded data, or performing the encoding operation by using the most significant bits, the center significant bits and the least significant bits of the memory cells on the different word lines and/or in the different sub blocks to generate the encoded data. As a result, each encoded data can have the more consistent error checking and correcting capability to increase the data decoding success rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data encoding method for a rewritable non-volatile memory module, the rewritable non-volatile memory module having a plurality of memory cells, the plurality of memory cells having first significant bits and second significant bits respectively, the plurality of memory cells forming a plurality of physical programming unit groups, each physical programming unit group among the plurality of physical programming unit groups having a plurality of physical programming units, the data encoding method comprising:

writing a first data into a first physical programming unit of a first physical programming unit group among the plurality of physical programming unit groups, wherein a plurality of first memory cells among the plurality of memory cells form the first physical programming unit group, and the first significant bits in the plurality of first memory cells form the first physical programming units and are configured to store the first data;

writing a second data into a second physical programming unit of a second physical programming unit group among the plurality of physical programming unit groups, wherein a plurality of second memory cells among the plurality of memory cells form the second physical programming unit group, and the second significant bits in the plurality of second memory cells form the second physical programming units and are configured to store the second data; and encoding the first data and the second data to generate an encoded data.

2. The data encoding method according to claim 1, further comprising:

writing the encoded data into a third physical programming unit group among the plurality of physical programming unit groups.

3. The data encoding method according to claim 1, wherein the plurality of memory cells further comprises third significant bits respectively, and the method further comprises:

writing a third data into a third physical programming unit of a fourth physical programming unit group among the plurality of physical programming unit groups, wherein a plurality of third memory cells among the plurality of memory cells form the fourth physical programming unit group, and the third significant bits in the plurality of third memory cells form the third physical programming units and are configured to store the third data, wherein the step of encoding the first data and the second data to generate the encoded data comprises:

encoding the first data, the second data and the third data to generate the encoded data.

4. The data encoding method according to claim 3, wherein the rewritable non-volatile memory module comprises a plurality of word lines, and the plurality of memory cells are disposed on intersections between the word lines and a plurality of bit lines, wherein the plurality of first memory cells are located on a first word line among the word lines, the plurality of second memory cells are located on a second word line among the word lines, and the plurality of third memory cells are located on a third word line among the word lines.

5. The data encoding method according to claim 4, wherein the plurality of first memory cells are located on an intersection between the first word line and a first bit line group in the bit lines, the plurality of second memory cells are located on an intersection between the second word line and a second bit line group in the bit lines, the plurality of third memory cells are located on an intersection between the third word line and a third bit line group in the bit lines, and the first bit line group, the second bit line group and the third bit line group are different from one another.

6. The data encoding method according to claim 3, wherein the encoded data is configured to correct errors occurred when writing the first data, the second data and the third data into the first physical programming unit, the second physical programming unit and the third physical programming unit respectively.

7. The data encoding method according to claim 3, wherein the first physical programming unit is an upper physical programming unit, the second physical programming unit is a lower physical programming unit, and the third physical programming unit is a center physical programming unit.

8. The data encoding method according to claim 1, wherein the step of encoding the first data and the second data to generate the encoded data comprises:

encoding the first data and the second data by using a RS codes algorithm or an XOR algorithm to generate the encoded data.

9. A memory control circuit unit for controlling a rewritable non-volatile memory module, wherein the rewritable non-volatile memory module has a plurality of memory cells, the plurality of memory cells has first significant bits and second significant bits respectively, the plurality of memory cells form a plurality of physical programming unit groups, each physical programming unit group among the plurality of physical programming unit groups has a plurality of physical programming units, and the memory control circuit unit comprising:

a host interface, configured to couple to a host system;

a memory interface, configured to couple to a rewritable non-volatile memory module;

a memory management circuit, coupled to the host interface and the memory interface, wherein the memory management circuit is configured to write a first data into a first physical programming unit of a first physical programming unit group among the plurality of physical programming unit groups, wherein a plurality of first memory cells among the plurality of memory cells form the first physical programming unit group, and the first significant bits in the plurality of first memory cells form the first physical programming units and are configured to store the first data, wherein the memory management circuit is further configured to write a second data into a second physical programming unit of a second physical programming unit group among the plurality of physical programming unit groups, wherein a plurality of second memory cells among the plurality of memory cells form the second physical programming unit group, and the second significant bits in the plurality of second memory cells form the second physical programming units and are configured to store the second data, wherein the memory management circuit is further configured to encode the first data and the second data to generate an encoded data.

10. The memory control circuit unit according to claim 9, wherein the memory management circuit writes the encoded data into a third physical programming unit group among the plurality of physical programming unit groups.

11. The memory control circuit unit according to claim 9, wherein the plurality of memory cells further comprises third significant bits respectively, wherein the memory management circuit writes a third data into a third physical programming unit of a fourth physical programming unit group among the plurality of physical programming unit groups, wherein a plurality of third memory cells among the plurality of memory cells form the fourth physical programming unit group, and the third significant bits in the plurality of third memory cells form the third physical programming units and are configured to store the third data, wherein in the operation of encoding the first data and the second data to generate the encoded data, the memory management circuit encodes the first data, the second data and the third data to generate the encoded data.

12. The memory control circuit unit according to claim 11, wherein the rewritable non-volatile memory module comprises a plurality of word lines, and the plurality of memory cells are disposed on intersections between the word lines and a plurality of bit lines, wherein the plurality of first memory cells are located on a first word line among the word lines, the plurality of second memory cells are located on a second word line among the word lines, and the plurality of third memory cells are located on a third word line among the word lines.

13. The memory control circuit unit according to claim 12, wherein the plurality of first memory cells are located on an intersection between the first word line and a first bit line group in the bit lines, the plurality of second memory cells are located on an intersection between the second word line and a second bit line group in the bit lines, the plurality of third memory cells are located on an intersection between the third word line and a third bit line group in the bit lines, and the first bit line group, the second bit line group and the third bit line group are different from one another.

14. The memory control circuit unit according to claim 11, wherein the encoded data is configured to correct errors occurred when writing the first data, the second data and the third data into the first physical programming unit, the second physical programming unit and the third physical programming unit respectively.

15. The memory control circuit unit according to claim 11, wherein the first physical programming unit is an upper physical programming unit, the second physical programming unit is a lower physical programming unit, and the third physical programming unit is a center physical programming unit.

16. The memory control circuit unit according to claim 9, wherein in the operation of encoding the first data and the second data to generate the encoded data, the memory management circuit encodes the first data and the second data by using a RS codes algorithm or an XOR algorithm to generate the encoded data.

17. A memory storage device, comprising:

a connection interface unit, configured to couple to a host system;

a rewritable non-volatile memory module, having a plurality of memory cells, the plurality of memory cells having first significant bits and second significant bits respectively, the plurality of memory cells forming a plurality of physical programming unit groups, each physical programming unit group among the plurality of physical programming unit groups having a plurality of physical programming units; and a memory control circuit unit, coupled to the connection interface unit and the rewritable non-volatile memory module, wherein the memory control circuit unit is configured to write a first data into a first physical programming unit of a first physical programming unit group among the plurality of physical programming unit groups, wherein a plurality of first memory cells among the plurality of memory cells form the first physical programming unit group, and the first significant bits in the plurality of first memory cells form the first physical programming units and are configured to store the first data, wherein the memory control circuit unit is further configured to write a second data into a second physical programming unit of a second physical programming unit group among the plurality of physical programming unit groups, wherein a plurality of second memory cells among the plurality of memory cells form the second physical programming unit group, and the second significant bits in the plurality of second memory cells form the second physical programming units and are configured to store the second data, wherein the memory control circuit unit is further configured to encode the first data and the second data to generate an encoded data.

18. The memory storage device according to claim 17, wherein the memory control circuit unit writes the encoded data into a third physical programming unit group among the plurality of physical programming unit groups.

19. The memory storage device according to claim 17, wherein the plurality of memory cells further comprises third significant bits respectively, wherein the memory control circuit unit writes a third data into a third physical programming unit of a fourth physical programming unit group among the plurality of physical programming unit groups, wherein a plurality of third memory cells among the plurality of memory cells form the fourth physical programming unit group, and the third significant bits in the plurality of third memory cells form the third physical programming units and are configured to store the third data, wherein in the operation of encoding the first data and the second data to generate the encoded data, the memory control circuit unit encodes the first data, the second data and the third data to generate the encoded data.

20. The memory storage device according to claim 19, wherein the rewritable non-volatile memory module comprises a plurality of word lines, and the plurality of memory cells are disposed on intersections between the word lines and a plurality of bit lines, wherein the plurality of first memory cells are located on a first word line among the word lines, the plurality of second memory cells are located on a second word line among the word lines, and the plurality of third memory cells are located on a third word amongline the word lines.

21. The memory storage device according to claim 20, wherein the plurality of first memory cells are located on an intersection between the first word line and a first bit line group in the bit lines, the plurality of second memory cells are located on an intersection between the second word line and a second bit line group in the bit lines, the plurality of third memory cells are located on an intersection between the third word line and a third bit line group in the bit lines, and the first bit line group, the second bit line group and the third bit line group are different from one another.

22. The memory storage device according to claim 19, wherein the encoded data is configured to correct errors occurred when writing the first data, the second data and the third data into the first physical programming unit, the second physical programming unit and the third physical programming unit respectively.

23. The memory storage device according to claim 19, wherein the first physical programming unit is an upper physical programming unit, the second physical programming unit is a lower physical programming unit, and the third physical programming unit is a center physical programming unit.

24. The memory storage device according to claim 17, wherein in the operation of encoding the first data and the second data to generate the encoded data, the memory control circuit unit encodes the first data and the second data by using a RS codes algorithm or an XOR algorithm to generate the encoded data.

25. A data encoding method for a rewritable non-volatile memory module, the rewritable non-volatile memory module having a plurality of memory cells, each memory cell in the plurality of memory cells having one of a plurality of storage state, each storage state in the storage states having a first significant bit and a second significant bit, the data encoding method comprising:

programming a first memory cell among the plurality of memory cells so that the first memory cell has a first storage state among the storage states;

programming a second memory cell among the plurality of memory cells so that the second memory cell has a second storage state among the storage states; and performing an encoding operation according to the first significant bit in the first storage state and the second significant bit in the second storage state to generate an encoded data.

26. The data encoding method according to claim 25, further comprising:

writing the encoded data into at least one of the plurality of memory cells.

27. The data encoding method according to claim 25, wherein each storage state among the storage states further comprises a third significant bit, and the method further comprises:

programming a third memory cell among the plurality of memory cells so that the third memory cell has a third storage state among the storage states, wherein the step of performing the encoding operation according to the first significant bit in the first storage state and the second significant bit in the second storage state to generate the encoded data comprises:

performing the encoding operation according to the first significant bit in the first storage state, the second significant bit in the second storage state and the third significant bit in the third storage state to generate the encoded data.

28. The data encoding method according to claim 27, wherein the rewritable non-volatile memory module comprises a plurality of word lines, and the plurality of memory cells are disposed on intersections between the word lines and a plurality of bit lines, wherein the first memory cells are located on a first word line in the word lines, the second memory cells are located on a second word line in the word lines, and the third memory cells are located on a third word line in the word lines.

29. The data encoding method according to claim 28, wherein the first memory cells are located on an intersection between the first word line and a first bit line group in the bit lines, the second memory cells are located on an intersection between the second word line and a second bit line group in the bit lines, the third memory cells are located on an intersection between the third word line and a third bit line group in the bit lines, and the first bit line group, the second bit line group and the third bit line group are different from one another.

* * * * *